United States Patent
Sato et al.

(10) Patent No.: US 7,410,673 B2
(45) Date of Patent: Aug. 12, 2008

(54) SMOOTH BOARD AND PROCESS FOR PREPARING A SMOOTH BOARD

(75) Inventors: Kiyoshi Sato, Tokyo (JP); Kazunori Kitamura, Tokyo (JP)

(73) Assignee: San-ei Kagaku Co., Ltd. (JP)

( * ) Notice: Subject to any disclaimer, the term of this patent is extended or adjusted under 35 U.S.C. 154(b) by 101 days.

(21) Appl. No.: 10/920,809

(22) Filed: Aug. 18, 2004

(65) Prior Publication Data

US 2005/0019582 A1    Jan. 27, 2005

Related U.S. Application Data

(63) Continuation of application No. 10/191,126, filed on Jul. 8, 2002, now Pat. No. 6,812,299.

(30) Foreign Application Priority Data

Jul. 19, 2001    (JP) .............................. 2001-253678

(51) Int. Cl.
*B05D 3/02* (2006.01)
*B05D 3/10* (2006.01)
*B05D 3/12* (2006.01)
*C08L 63/10* (2006.01)

(52) U.S. Cl. ..................... 427/386; 427/340; 427/341; 427/355; 427/379; 525/485; 525/486; 525/524; 525/525; 525/526

(58) Field of Classification Search .................. None
See application file for complete search history.

(56) References Cited

U.S. PATENT DOCUMENTS

| 6,063,876 | A | 5/2000 | Hayakawa et al. | |
| 6,255,409 | B1 * | 7/2001 | Matsuoka et al. | 525/524 |
| 6,475,701 | B2 | 11/2002 | Ohno et al. | |
| 6,812,299 | B2 * | 11/2004 | Sato et al. | 525/486 |

FOREIGN PATENT DOCUMENTS

| EP | 0 943 639 | | 9/1999 |
| JP | 63-154780 A | * | 6/1988 |
| JP | 63154780 A | | 6/1988 |
| JP | 7196952 | | 8/1995 |
| JP | 9-71637 A | * | 3/1997 |
| JP | 9071637 | | 3/1997 |
| JP | 200159859 A2 | | 6/2000 |
| JP | 2001-181482 A | * | 7/2001 |
| JP | 2001181482 | | 7/2001 |

* cited by examiner

*Primary Examiner*—Robert Sellers
(74) *Attorney, Agent, or Firm*—Quarles & Brady, LLP

(57) ABSTRACT

The thermosetting resin composition which is valuable for an undercoat of a printed wiring board, and does not leave an air bubble in a cured film, and makes the surface polishing easy and can form a smooth printed wiring board comprises (I) an adduct of epoxy resin with unsaturated aliphatic acid, (II) a (meth) acrylate, (III) a radical polymerization initiator, (IV) a crystallizable epoxy resin, and (V) a latent curing agent.

16 Claims, 4 Drawing Sheets

US 7,410,673 B2

SMOOTH BOARD AND PROCESS FOR PREPARING A SMOOTH BOARD

CROSS REFERENCES TO RELATED APPLICATIONS

This application is a continuation application of U.S. patent application Ser. No. 10/191,126 filed on Jul. 8, 2002, now U.S. Pat. No. 6,812,299.

STATEMENT REGARDING FEDERALLY SPONSORED RESEARCH

Not Applicable.

BACKGROUND OF THE INVENTION

1. Field of the Invention

The present invention generally relates to a thermosetting resin composition, suitable for use in a process for preparing a smooth board. More particularly, the present invention relates to a thermosetting resin composition suitable for an undercoat of a printed wiring board without unevenness on its surface.

2. Discussion of Background

A printed wiring board is a board on which a conductor circuit is formed on one or both sides of an insulating substrate. It may be further coated with a protective layer of solder-resist as a topcoat.

However, a conventional printed wiring board coated with a topcoat has a defect in that hollows (6) form in the surface of the topcoat (2) as shown in FIG. 7. As a result, there have been problems in that reliable connections cannot be obtained when electronic parts are mounted and a fine particles of solder enter the hollows (6), to causing short-circuits.

The present inventors have studied the above-described problems and have concluded that the hollows (6) on the surface of the topcoat (2) are brought about by the recesses (7) on the surface of the insulating substrate (4) formed by the presence of the conductor circuit (3) as shown in FIG. 8. Accordingly, in order to obtain a smooth topcoat without unevenness, a thermosetting resin is filled into the recesses (7) between the conductor circuits and cured to form an undercoat (1) and then the undercoat (1) is polished to form a smooth surface to which the topcoat (2) is laminated as shown in FIG. 1.

Various kinds of thermosetting resin compositions have been proposed as a surface coating agent for a printed wiring board. For example, Unexamined Japanese Patent Publication (Kokai) No. 63-81187 and Unexamined Japanese Patent Publication (Kokai) No. 63-154780 describe a thermosetting resin composition comprising an epoxymethacrylate resin, a copolymerizable crosslinking agent such as acrylic ester and the like, a radical polymerization initiator, a liquid epoxy resin and a curing agent.

However, when the resin composition described in the above-described publications is applied to a printed wiring board as the above-described undercoat, air bubbles often remain in the resin coated. As a result, air bubbles remain in the hardened film (undercoat) and so the properties of the printed wiring board, such as heat resistance, humidity resistance and the like suffer. Therefore, the resin composition described in the above-described publications is not suitable as an undercoat.

Unexamined Japanese Patent Publication (Kokai) No. 8-162573 describes a thermosetting resin composition comprising a novolak-type epoxy resin, a curing agent, a crystallizable epoxy resin, and a curing accelerator such as imidazole and the like.

However, when the resin composition described in the above-described publication is applied to a printed wiring board as an undercoat and is cured, an extremely hard undercoat is formed. Therefore, the polishing of the surface is very hard to carry out, and fine polishing can not be carried out. As a result, a highly smooth surface can be hardly obtained. Therefore, the resin composition described in the above-described publication is also unsuitable as an undercoat.

SUMMARY OF THE INVENTION

An object of the present invention is to provide a thermosetting resin composition which does not leave air bubbles in a cured film and which forms a cured film whose surface can be easily polished.

According to the present invention, there is provided a thermosetting resin composition comprising (I) an adduct of epoxy resin with unsaturated aliphatic acid, (II) a (meth) acrylate, (III) a radical polymerization initiator, (IV) a crystallizable epoxy resin, and (V) a latent curing agent.

Thus, a smooth board can be prepared by applying the above-described thermosetting resin composition to the recess in the surface of the substrate, carrying out a primary curing at a low temperature, polishing the surface and then carrying out a secondary curing at a high temperature.

In a preferred use, the present invention provides a process for preparing a smooth printed wiring board which comprises applying the above-described thermosetting resin composition to the recess in the surface of a printed wiring board, carrying out a primary curing at a low temperature, polishing the surface and then carrying out a secondary curing at a high temperature. This provides a smooth printed wiring board. Another process comprises preparing a smooth multi-layer printed wiring board by applying the above-described thermosetting resin composition to a via on the surface of the multi-layer printed wiring board, carrying out a primary curing at a low temperature, polishing the surface to form a conductor circuit, coating with an insulating layer and/or protective layer, and then carrying out a secondary curing at a high temperature. This also provides a smooth, multi-layer printed wiring board.

BRIEF DESCRIPTION OF THE DRAWINGS

A more complete understanding of the present invention may be had with reference to the following detailed explanations which are given in connection with the accompanying drawings, in which.

Figure 1:
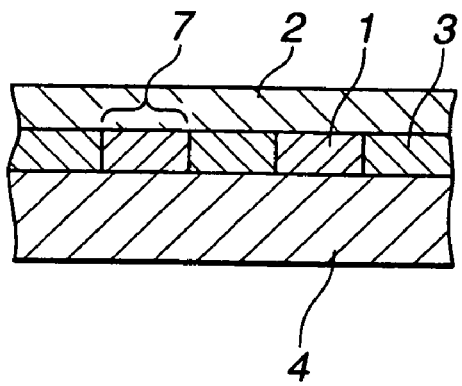
FIG. 1 is a cross-sectional view of the printed wiring board the recess between conductor circuits on which is smoothed according to the present invention.

The thermosetting resin composition of the present invention contains an adduct of epoxy resin with unsaturated aliphatic acid as a component (I).

The epoxy value of the epoxy resin as a raw material for preparing the component (I) (hereinafter sometimes referred to as "epoxy resin for a raw material") is for example 130~400, particularly preferably 150~250. When the epoxy value is less than 130, the viscosity of the epoxy resin obtained is often extremely low and application properties degrade. Contrary to this, when the epoxy value is in excess of 400, the crosslinking density of a cured film often decreases and the heat-resistance degrades.

Further, the number of epoxy group of the epoxy resin for the raw material is preferably at least two, and usually three and above. When the number of epoxy group is one, the epoxy group is often used for the primary curing reaction described later and can not take part in the secondary curing reaction. As a result, a cured film having sufficient crosslinking density can not be obtained and the heat-resistance of the cured film is not sufficient.

Examples of the epoxy resin for the raw material include, for example, an epoxy resin from polyfunctional phenol, an epoxy resin having a naphthalene skeleton, a glycidylamine-type epoxy resin, an epoxy resin having a triazine skeleton, a glycidylester-type epoxy resin, an alicyclic-type epoxy resin and so on.

Examples of the epoxy resin from polyfunctional phenol include an orthocresol novolak-type, a bisphenol (DPP) novolak-type, a trifunctional-type (tirshydroxyphenyl-methane and so on), an alkyl-substituted trifunctional-type, a tetrafunctional-type (tetraphenylolethane and so on), a dicyclopentadienephenole-type and other epoxy resins. Concrete examples include those illustrated by structural formulae 1~25 in Tables 1~4.

TABLE 1

| name (chemical name) | structural formula |
|---|---|
| orthocresol novolak-type (1) | |
| bisphenol (DPP) novolak-type (2) | |
| trifunctional-type (tirshydroxyphenylmethane-type) (3) | |

TABLE 1-continued

| name (chemical name) | structural formula |
|---|---|
| alkyl-substituted trifunctional-type (4) | (structure with two R$_1$, R$_2$ substituted phenyl rings connected via CH to a third phenyl ring, each bearing OCH$_2$CH—CH$_2$ epoxide groups) |
| trifunctional-type (5) | (structure with central C bonded to two glycidyloxyphenyl groups and one phenyl-C(CH$_3$)$_2$-phenyl-O—CH$_2$—CH—CH$_2$ epoxide group) |
| tetrafunctional-type, tetraphenylolethane (6) | (structure with HC—CH central linkage bearing four glycidyloxyphenyl groups) |

TABLE 2

| name (chemical name) | structural formula |
|---|---|
| dicyclopentadienephenole-type (7) | (repeating structure with glycidyloxy-methylphenyl groups linked via dicyclopentadiene units, with subscript n on middle repeat unit) |
| 8 | (triphenylmethane structure with three OG groups, one on each phenyl ring) |

TABLE 2-continued
name
(chemical name) structural formula
9 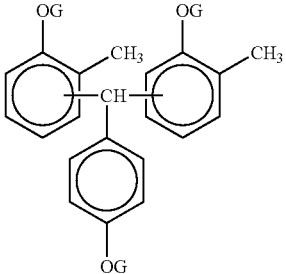
10 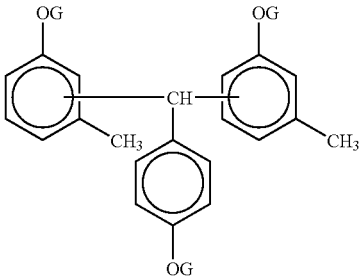
11 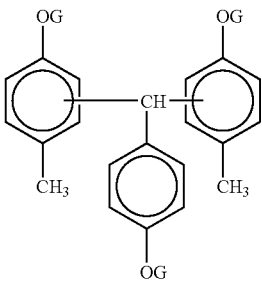
12 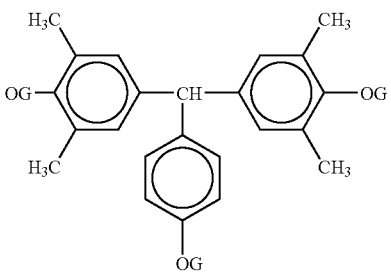
13 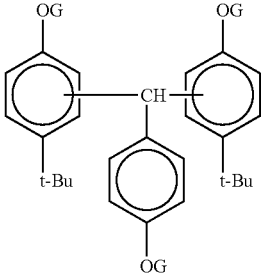

TABLE 2-continued
| name (chemical name) | structural formula |
|---|---|
| 14 | 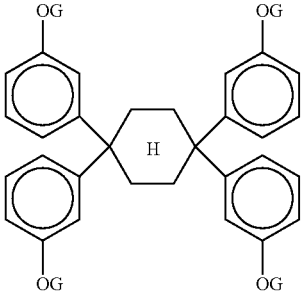 |
| 15 | 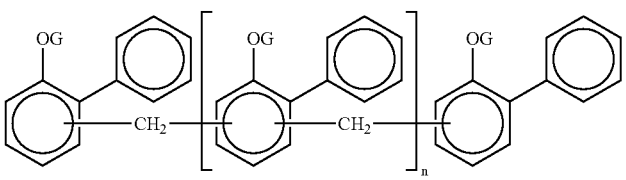 |
TABLE 3
| name (chemical name) | structural formula |
|---|---|
| 16 | 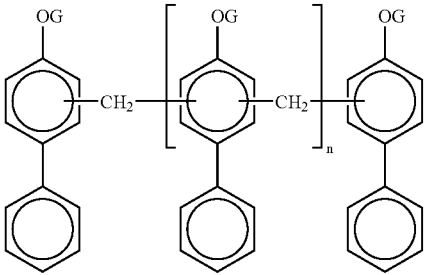 |
| 17 | 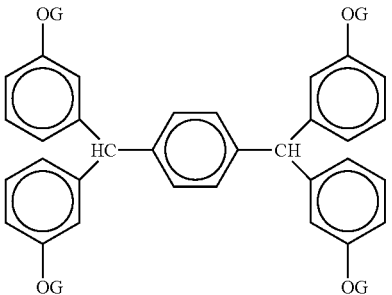 |
| 18 | 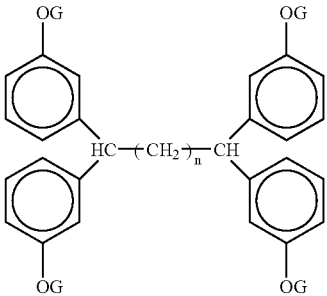 |

TABLE 3-continued

| name (chemical name) | structural formula |
| --- | --- |
| 19 | (structure: bis(3-tBu-2-OG-5-Me-phenyl)(4-OG-phenyl)methane) |
| 20 | (structure: α,ω-bis(4-OG-phenyl) poly[CH(phenyl)-(4-OG-phenylene)] repeating unit, n) |
| 21 | (structure: 4-OG-phenyl-CH₂-(1,4-phenylene)-CH₂-[4-OG-phenylene-CH₂-(1,4-phenylene)-CH₂]ₙ- 4-OG-phenyl) |
| 22 | (structure: bis(3-tBu-2-OG-5-Me-phenyl)(4-OG-phenyl)methane) |

TABLE 4

| name (chemical name) | structural formula |
| --- | --- |
| 23 | (structure: tetrakis(4-OG-phenyl)methane) |

TABLE 4-continued

| name (chemical name) | structural formula |
|---|---|
| 24 | (structure: central CH bonded to three aryl groups — two 2-OG-3-tBu-5-Me-phenyl groups and one 4-OG-phenyl group) |
| 25 | CH₂(O)CH—CH₂—O—[phenyl(—CH₂—C₆H₄—C₆H₄—CH₂—)phenyl]ₙ—H with terminal O—CH₂—CH(O)CH₂ glycidyl group |

In the structural formulae 1, 2, 3, 7, 15, 20 and 21, n is an integer of 0 to 30, respectively. In the structural formula 16, n is an integer of 0 to 20. In the structural formula 18, n is an integer of 0 to 2. In the structural formula 25, n is an integer of 1 to 30. In the structural formula 2, $R_1$ and $R_2$ are independently H or $CH_3$, respectively. In the structural formula 4, $R_1$ is t-$C_4H_9$ and $R_2$ is $CH_3$. In the Tables 2 to 4, G is a glycidyl group.

Preferable examples are those illustrated by the structural formulae 1, 2, 3 and 7.

Examples of epoxy resin having a naphthalene skeleton include a naphthaleneaaralkyl-type epoxy resin and so on. Concrete examples include those illustrated by the structural formulae 26 to 32 shown in Table 5.

TABLE 5

| name (chemical name) | structural formula |
|---|---|
| 26 | (naphthyl-OG)—CH₂—(2,5-disubstituted-4-OG-3-CH₃-phenyl)—CH₂—(naphthyl-OG) |
| 27 | [(OG-naphthyl)—CH₂—(OG-naphthyl)]ₙ—H |
| 28 | (1-OG-4-t-Bu-naphthyl)—CH(4-OG-phenyl)—(1-OG-4-t-Bu-naphthyl) |

TABLE 5-continued

| name (chemical name) | structural formula |
|---|---|
| 29 | (structure: two naphthalene units linked by CH₂, with OG substituents, bracketed with H— and —ₙ) |
| 30 | (structure: naphthalene–CH₂–phenyl–CH₂–naphthalene with OG groups, bracketed with H and n) |
| 31 | (structure: naphthalene with two OG groups –CH₂–phenyl–CH₂– naphthalene with two OG groups, bracketed with H and n) |
| 32 | (structure: naphthalene with OG and GO substituents) |

In the structural formulae 27, 30 and 31, n is an integer of 1 to 30, respectively. In the structural formula 29, n is an integer of 2 to 30. In Table 5, G is a glycidyl group.

Preferable examples are those illustrated by the structural formulae 27 and 31.

Examples of glycidylamine-type epoxy resin include a poly (for example, tri or tetra) glycidylamine-type epoxy resin. Concrete examples include those illustrated by the structural formulae 33 to 36 in Table 6.

TABLE 6

| name (chemical name) | structural formula |
|---|---|
| 33 | (structure: bis[N,N-bis(glycidyl)amino]phenyl methane — two phenyl rings joined by CH₂, each with N(CH₂-CHCH₂O)₂ groups) |
| 34 | (structure: phenyl ring with N(CH₂-CHCH₂O)₂ and OCH₂CH-CH₂O glycidyl ether) |

TABLE 6-continued

| name (chemical name) | structural formula |
|---|---|
| 35 | (structure) |
| 36 | (structure) |

A concrete example of epoxy resin having a triazine skeleton is illustrated by the structural formula (1):

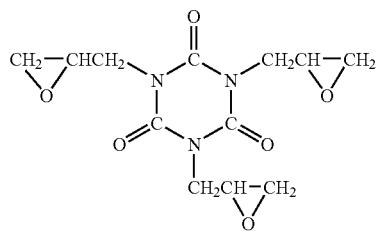

(1)

Examples of glycidylester-type epoxy resin include a dimer acid-type epoxy resin such as dimer acid diglycidylester and so on, a phthalic acid-type epoxy resin such as hexahydrophthalic acid diglycidylester and so on, a glycidylacrylate, a glycidylmethacrylate and so on.

Examples of alicyclic-type epoxy resin include a cyclohexeneoxide-type epoxy resin. Concrete examples include those illustrated by the structural formulae 37 to 41 in Table 7. In the structural formula 41, M is an integer of 2 to 50. Epoxy resins illustrated by the structural formula 41 are preferable.

TABLE 7

| name (chemical name) | structural formula |
|---|---|
| 37 | (structure) |
| 38 | (structure) |

TABLE 7-continued

| name (chemical name) | structural formula |
|---|---|
| 39 | (structure) |
| 40 | (structure) |
| 41 | (structure with RO, O-H, M, O) |

Examples of unsaturated aliphatic acid as another raw material for preparation of the component (I) include those illustrated by the following formula (2):

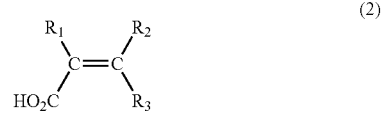

(2)

[Wherein, $R_1$ to $R_3$ is independently H or $CH_3$, respectively.] Concrete examples of the unsaturated aliphatic acid include an acrylic acid, a methacrylic acid, and a crotonic acid and so on.

The component (I) may be prepared by a conventional preparation method. For example, it may be prepared by mixing at least one kind of epoxy resin for the raw material with at least one kind of unsaturated aliphatic acid (for example acrylic acid and/or methacrylic acid (hereinafter referred sometimes to as "(meth) acrylic acid")with stirring under heating, if necessary.

It is preferable to add the unsaturated aliphatic acid to 20~80%, particularly 40~60% of epoxy groups in the epoxy resin for the raw material. An adduct in which an addition amount of the unsaturated aliphatic acid is less than 20% (hereinafter sometimes described as "less than 20% of unsaturated aliphatic acid adduct") causes stickiness of the thermosetting resin composition. Consequently, when it is applied to a substrate, the extra amount of the resin can not be sufficiently removed. Contrary to this, a "more than 80% of unsaturated aliphatic acid adduct" hardens the primary cured film. Consequently, the subsequent polishing is hard to carry out.

An example of the component (I) includes an adduct of a novolak-type epoxy resin with (meth) acrylates (particularly, an adduct of cresolnovolak-type epoxy resin with acrylic acid). At least one kind of these adducts may be contained in the thermosetting resin composition.

The thermosetting resin composition of the present invention contains (meth) acrylates (that is, acrylates and/or methacrylates) as the component (II).

Examples of the above-described acrylates for the component (II) include esters of acrylic acids with hydroxyl compounds and so on. Examples of the above-described methacrylates for the component (II) include esters of methacrylic acids with hydroxyl compounds and so on.

Examples of the above-described acrylates and methacrylates include unsaturated aliphatic acids illustrated by the afore-mentioned chemical formula (2). Concrete examples of acrylic acids and methacrylic acids include acrylic acid, methacrylic acid and crotonic acid and so on.

Examples of the above-described hydroxyl compounds include alcohols, (hemi) acetals or (hemi) ketals, hydroxyesters and so on.

Examples of the alcohols include low alcohol, cyclic alcohol, polyhydric alcohols, aromatic alcohols and so on.

Examples of the low alcohol include alcohols having C1~C10. Concrete examples of the low alcohol include butanol, hexanol, 2-ethylhexylalcohol and so on.

Examples of the cyclic alcohol include monocyclic or polycyclic (bicyclic, tricyclic and so on) alkyl or alkenyl alcohol. Concrete examples of the cyclic alcohol include dicyclopentanyl alcohol, dicyclopentenyl alcohol, isobonilic alcohol, furufuryl alcohol, and so on.

Examples of the polyhydric alcohols include polyhydric alcohol and derivatives thereof, for example, a partial ether of polyhydroxy alcohol, an adduct of polyhydroxy alcohol with ethylene oxide (EO adduct), a partial ester of polyhydroxy alcohol and so on.

Examples of the polyhydric alcohol include alkanediole or cycloalkanediole having C2~C8, glycols, bisphenol A, erythritol and so on.

Concrete examples of the polyhydric alcohol include 1,3-propanediole, ethylene glycol, dicyclopentanediol, neopentylglycol, diethylene glycol, polyethylene glycol, 1, 4-butanediol, bispheno-A, pentaerythritol, dipentaerythritol, ditrimethylolpropane and so on.

Examples of the partial ether of polyhydroxy alcohol include a partial aryl ether of the above-described polyhydroxy alcohol (partial phenyl or cresyl ether and so on), partial alkyl ("alkyl" having C1~C4) or alkenyl ("alkenyl" having C1~C4) ether (partial butyl ether, partial allyl ether and so on) and so on.

Examples of the adduct of polyhydroxy alcohol with ethylene oxide (EO adduct) include a mono EO adduct of the above-described polyhydroxy alcohol, POE (EO polymerization degree is 2~6) ether-modified compounds and so on. In this case, EO may be added to a part or all hydroxyl groups in the polyhydroxy alcohol.

The partial ester of the polyhydroxy alcohol is, for example, an ester of the above-described polyhydroxy alcohol with carbocyclic carboxylic acid (benzoic ester and so on), a hydroxy acid ester (hydroxypivalic acid and so on) and so on.

Examples of the aromatic alcohol include benzyl alcohol and so on.

Examples of the (hemi) acetals or (hemi) ketals for the above-described hydroxyl compounds include condensates of the above-described alcohols (for example, cyclic alcohol, polyhydroxy alcohol and so on) with formaldehyde or hydroxyaldehyde. Concrete examples include formaldehyde·dicyclopentenyl·hemiacetal, tricyclodecanedimethanol, neopenthylglycol-modified trimethylolpropane and so on.

The hydroxy acid ester as a hydroxyl compound is, for example, a ring cleavage adduct of caprolactone with furfuryl alcohol, hydroxypivalic acid neopenthylglycol and so on.

The component (II) is preferably a compound which is cured singly to form a cured substance having Tg (° C.) of 30~180, particularly 120~150. When Tg is less than 80, the primary cured film is sometimes sticky. Contrary to this, when Tg is in excess of 180, the primary cured film is sometimes extremely hard.

When the component (II) does not contain a hydrophilic group such as a carboxylic group, hydroxyl group and so on, the hygroscopicity of the thermosetting resin composition can be kept very low. As a result, the humidity-resistance of the cured film can be increased.

Concrete examples of the component (II) are compounds illustrated by the structural formulae 42~72 shown in Tables 8~11.

TABLE 8

| name (chemical name) | structural formula |
|---|---|
| 42 | 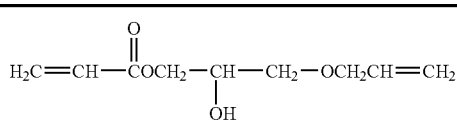 |
| 43 | 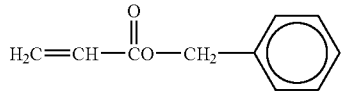 |
| 44 | 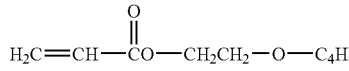 |
| 45 | 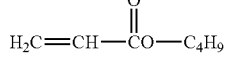 |
| 46 | 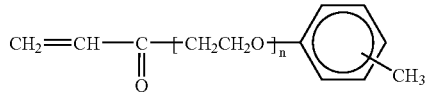 |

TABLE 8-continued
| name (chemical name) | structural formula |
|---|---|
| 47 | 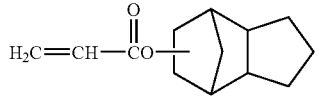 |
| 48 | 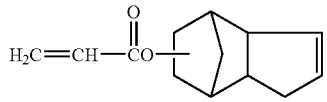 |
TABLE 8-continued
| name (chemical name) | structural formula |
|---|---|
| 49 | 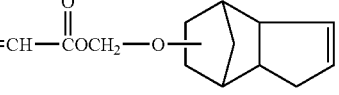 |
TABLE 9
| name (chemical name) | structural formula |
|---|---|
| 50 | 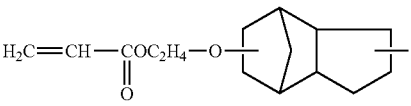 |
| 51 | 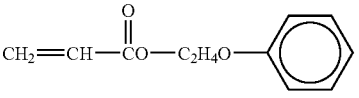 |
| 52 | 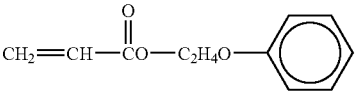 |
| 53 | 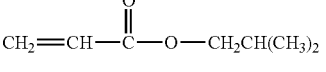 |
| 54 | 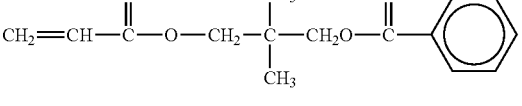 |
| 55 | 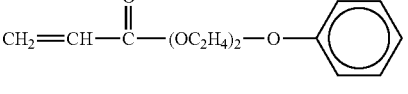 |
| 56 | 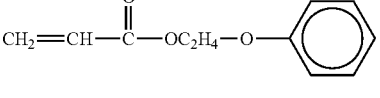 |
| 57 | 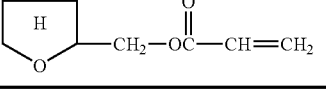 |
TABLE 10
| name (chemical name) | structural formula |
|---|---|
| 58 | 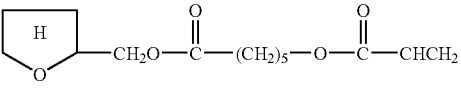 |

TABLE 10-continued

| name (chemical name) | structural formula |
|---|---|
| 59 | CH$_2$=CH—C(=O)—O—C(CH$_3$)$_3$ |
| 60 | CH$_2$=CH—C(=O)O-CH$_2$CH$_2$—CH(CH$_3$)—OC(=O)—CH=CH$_2$ |
| 61 | CH$_2$=CH—C(=O)O-CH$_2$CH$_2$—CH(CH$_3$)—OC(=O)—CH=CH$_2$ |
| 62 | CH$_2$=CH—C(=O)—OCH$_2$—C(CH$_3$)$_2$—CH$_2$—OC(=O)—C(CH$_3$)$_2$—CH$_2$—OC(=O)—CH=CH$_2$ |
| 63 | CH$_2$=CH—C(=O)—O—CH$_2$—C(CH$_3$)$_2$—CH$_2$—O—C(=O)—CH=CH$_2$ |
| 64 | H$_2$C=CH—C(=O)OCH$_2$—O—[dicyclic]—O—CH$_2$O—C(=O)—CH=CH$_2$ |
| 65 | CH$_2$=CH—C(=O)O—CH$_2$—C(CH$_3$)$_2$—CH—(cyclic acetal with CH$_2$CH$_3$)—CH$_2$CH$_2$—OC(=O)—CH=CH$_2$ |

TABLE 11

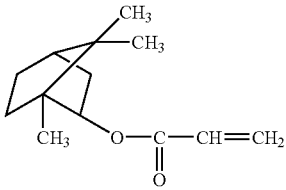

| name (chemical name) | structural formula |
|---|---|
| 66 | H$_2$C=CH—C(=O)O—(OC$_2$H$_4$)$_2$—C$_6$H$_4$—C(CH$_3$)$_2$—C$_6$H$_4$—(OC$_2$H$_4$)$_2$—OC(=O)—CH=CH$_2$ |
| 67 | isobornyl acrylate structure |
| 68 | H$_2$C=HC—C(=O)—O—CH$_2$—C(CH$_2$-O-C(=O)-CH=CH$_2$)(CH$_2$OH)—CH$_2$—O—C(=O)—CH=CH$_2$ |

TABLE 11-continued

| name (chemical name) | structural formula |
|---|---|
| 69 | (structure: pentaerythritol-based tetraacrylate with extended ether linkage, featuring H₂C=HC—C(=O)—O—H₂C groups and CH₂—O—C(=O)—CH=CH₂ groups connected through a central carbon with CH₂—O—CH₂ bridge) |
| 70 | (structure: similar to 69 but with H₃CH₂C— and —CH₂CH₃ substituents on central carbons, with two acrylate ester groups on each side) |
| 71 | (structure: central carbon connected to four CH₂—O—C(=O)—CH=CH₂ acrylate groups) |
| 72 | CH₂=CH—CO—N(morpholine ring) |

The component (II) may contain at least one kind of these compounds. The component (II) is preferably a compound illustrated by the structural formulae 47, 48, 49, 50, 64, 65, 67, 68 and 69. The component (II) may contain at least one kind of these compounds. In the structural formula 46, n is 1 or 2.

The thermosetting resin composition of the present invention contains as the component (III) a radical polymerization initiator taking part in the primary curing reaction. The component (III) is preferably a compound having the radical polymerization starting temperature higher than the melting point of the crystallizable epoxy resin described later (IV) and lower than the secondary curing reaction starting temperature. When the radical polymerization starting temperature is extremely low, the primary curing reaction sometimes takes place before air bubbles in the resin applied to the substrate have been sufficiently removed. Contrary to this, when the radical polymerization starting temperature is extremely high, the polishing of the surface of the substrate described later is sometimes hard to carry out, because the secondary curing reaction takes place before the primary curing reaction. The component (III) is preferably a compound having a radical polymerization temperature of 60~150° C., particularly 90~120° C.

Further, the component (III) is preferably such a compound that not an epoxy group but an unsaturated bond (particularly derived from the above-described unsaturated aliphatic acid) takes part in theprimary curing reaction.

Examples of the component (III) are organic peroxides such as ketoneperoxide, hydroperoxide, peroxyketal, diacylperoxide, dialkylperoxide, peroxycarbonate and peroxyester and so on. Concrete examples of the component (III) are t-butylperoxybenzoate, t-butylperoxy-2-ethylhexanoate, dicumylperoxide and so on. The component (III) may contain at least one kind of these compounds.

The thermosetting resin composition of the present invention contains a crystallizable epoxy resin as the component (IV). The component (IV) is preferably a compound having a melting point higher than ambient temperatures and lower than the primary curing reaction starting temperature, for example, a compound having a melting point of 80~110° C., particularly 90~105° C. When the melting point is lower than ambient temperatures or higher than the primary curing reaction starting temperature, the viscosity of the thermosetting resin composition sometimes does not decrease rapidly (or at all) under heating. As a result, air bubbles in the resin applied to the substrate can not be sufficiently removed.

Further, the viscosity (mPa·s) of the component (IV) is preferably 50 and below, particularly 0.1~20 between the temperature of the melting point and the primary curing reaction starting temperature. When the viscosity of the component (IV) (melted) is extremely high, air bubbles in the resin applied to the substrate can not be sufficiently removed.

Further, the component (IV) is preferably a compound only slightly soluble in the thermosetting resin composition. When the component (IV) is readily soluble in the thermosetting resin composition, the viscosity of the thermosetting resin composition does not decrease rapidly under heating. As a result, sufficient deaeration of the resin applied to the substrate can not be carried out, and air bubbles in the resin applied to the substrate can not be sufficiently removed.

Examples of the component (IV) are crystallizable epoxy resins such as biphenyl-type, hydroquinone-type, biphenyl-novolak-type and fluorene-type and so on. The component (IV) may contain at least one kind of these compounds. A concrete example of the biphenyl-type crystallizable epoxy resin is that illustrated by the structural formula (3);

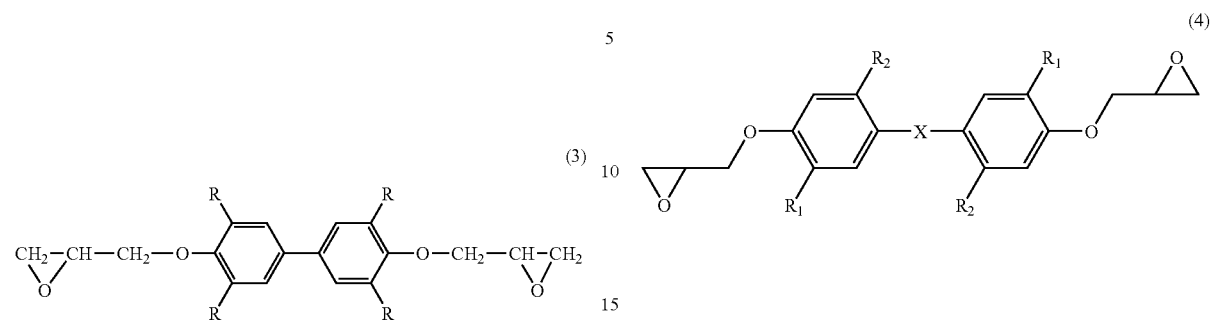

[Wherein, R is H or CH$_3$]. The component (IV) may contain at least one kind of these compounds.

A concrete example of the diphenyl-type crystallizable epoxy resin is that illustrated by the structural formula (4);

[Wherein, X is O or S, R$_1$ and R$_2$ may be the same or different to each other and denote H, CH$_3$ or t-butyl.] The component (IV) may contain at least one kind of these compounds. Concrete examples of the diphenyl-type crystallizable epoxy resin are those illustrated by the structural formulae 73~77 in Table 12. The component (IV) may contain at least one kind of these compounds.

TABLE 12

| name (chemical name) | structural formula |
|---|---|
| 73 | GO—⟨⟩—O—⟨⟩—OG |
| 74 | (tetramethyl diphenylmethane bis-glycidyl ether) |
| 75 | (bisphenol derivative bis-glycidyl ether) |
| 76 | (octamethyl diphenylmethane bis-glycidyl ether) |
| 77 | (tetramethyl biphenyl bis-glycidyl ether) |

A concrete example of the hydroquinone-type crystallizable epoxy resin is that illustrated by the structural formula (5);

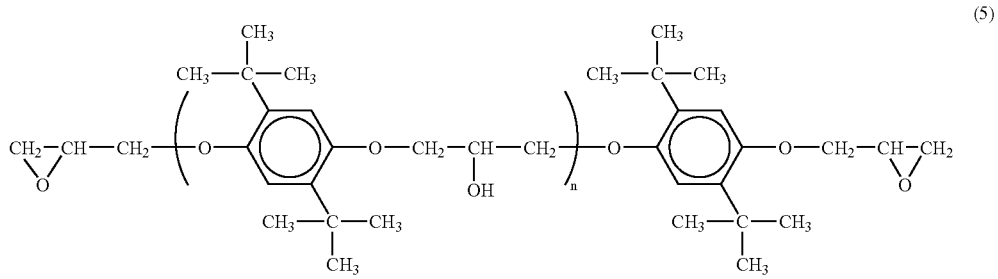

[Wherein, n is an integer of 0~2.] The component (IV) may contain at least one kind of these compounds.

A concrete example of the biphenylnovolak-type crystallizable epoxy resin is that illustrated by the structural formula (6);

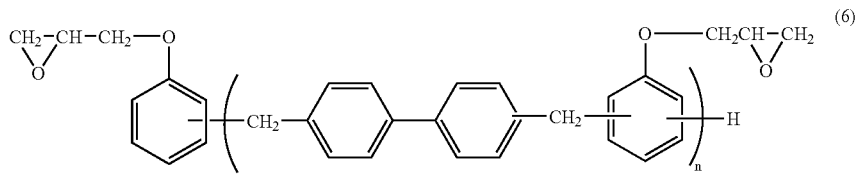

[Wherein, n is an integer 1 or 2.] The component (IV) may contain at least one kind of these compounds.

A concrete example of the fluorene-type crystallizable epoxy resin is that illustrated by the structural formula (7):

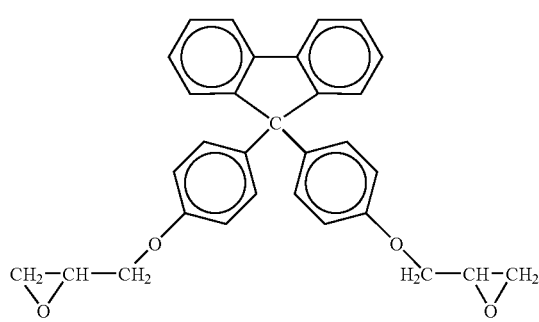

The thermosetting resin composition of the present invention contains a latent curing agent as the component (V). The component (V) causes the secondary curing reaction under heating. The component (V) is preferably a compound that has the secondary curing reaction starting temperature higher than the primary curing reaction starting temperature. When the secondary curing reaction starting temperature is extremely low, the secondary curing reaction often takes place before the primary curing reaction and the polishing of the surface of the substrate described later is sometimes hard to carry out. Contrary to this, when the secondary curing reaction starting temperature is extremely high, the printed wiring board per se often suffers thermal damage. The component (V) is preferably, for example a compound having the secondary curing starting temperature of 150~220° C., particularly 170~200° C.

Examples of the component (V) are dicyandiamide (DICY), imidazoles, $BF_3$-amine complex, amine adduct-type curing agent, amine-acid anhydride (polyamide) adduct-type curing agent, hydrazide-type curing agent, carboxylate of amine-type curing agent, onium salt and so on. The component (V) may contain at least one kind of these compounds.

Examples of the amine adduct-type curing agent as the component (V) are an adduct of imidazole-type curing agent (2-ethyl-4-methylimidazole, 2-methylimidazole and so on) or an amine-type curing agent (diethylamine) with an epoxy compound, urea or isocyanate compound.

Concrete examples of the hydrazide-type curing agent as the component (V) are adipicacid hydrazide(ADH), sebacic acid hydrazide(SDH) and so on.

Examples of the carboxylate of amine-type curing agent as the component (V) are a nylon salt, ATU (3,9-bis(3-aminopropyl)-2,4,8,10-tetraoxaspiro[5,5]undecane), adipate and so on.

Examples of the onium salt as the component (V) are sulfonium salt, ammonium salt, phosphonium salt and so on.

Concrete examples of the component (V) are those illustrated by the structural formulae 78~95 shown in Tables 13~15.

TABLE 13

| name (chemical name) | structural formula |
|---|---|
| 78 | H₂N—C(=NH)—NH—CN |
| 79 | 2,4-diamino-6-[2-(2-methyl-1-imidazolyl)ethyl]-1,3,5-triazine |
| 80 | isocyanuric acid (1,3,5-triazinane-2,4,6-trione) |
| 81 | 3,4-dichlorophenyl-N',N'-dimethylurea |
| 82 | cyclic bis-phthalamide of diethylenetriamine |
| 83 | HOOC-C₆H₄-C(=O)NH-CH₂CH₂-NH-CH₂CH₂-NH-[C(=O)-C₆H₄-C(=O)NH-CH₂CH₂-NH-CH₂CH₂-NH]ₙ-H |
| 84 | 5-isopropylhydantoin bis(aminocarbonylmethyl) derivative: H₂NHNCCH₂CH₂-N(ring)-CH₂CH₂CNHNH₂ |
| 85 | H₂NHN—C(=O)—(CH₂)₁₈—C(=O)—NHNH₂ |

TABLE 14

| name (chemical name) | structural formula |
|---|---|
| 86 | H₂NHNC(=O)(CH₂)₆CH=CH(CH₂)₂CH=CH(CH₂)₆C(=O)NHNH₂ |

TABLE 14-continued

| name (chemical name) | structural formula |
|---|---|
| 87 | NH₂NHCO-C₆H₄-CONHNH₂ (meta) |
| 88 | Triazine with NHCH₃, NH₂NH, NHNH₂ substituents |
| 89 | ⁺NH₃CH₂CH₂CH₂—[spiro bis-dioxane]—CH₂CH₂CH₂NHCOO⁻ |
| 90 | R₁-C₆H₄-CH(R₂)-⁺S(R₃)(R₄)   SbF₆⁻ |
| 91 | R₁-C₆H₄-CH(R₂)-⁺N(R₃)(R₃)(R₃)   SbF₆⁻ |
| 92 | R₁-C₆H₄-CH(R₂)-⁺S(R₃)-C₆H₄-R₄   SbF₆⁻ |
| 93 | R₁-C₆H₄-CH(R₂)-⁺N(pyridinium)   SbF₆⁻ |

TABLE 15

| name (chemical name) | structural formula |
|---|---|
| 94 | R₁-C₆H₄-CH₂-⁺P(C₆H₅)₃   SbF₆⁻ |
| 95 | CH₂O-C₆H₄-CH₂-⁺N(2-cyanopyridinium)   SbF₆⁻ |

The component (V) may contain at least one kind of these compounds. The compounds illustrated by the structural formulae 78, 79 and 80 are preferable. In the structural formula 83, n is an integer of 0~3.

Various kinds of additives may be added to the thermosetting resin composition of the present invention. Examples of the additives include a filler, an organic.inorganic coloring agent, a fire retardant, an anti-foaming agent and so on. The thermosetting resin composition of the present invention may contain at least one kind of these additives.

Examples of the filler are barium sulfate, silica, aluminum hydroxide magnesium hydroxide, alumina, titanium oxide, zirconium oxide, zirconium silicate, calcium carbonate, talk, mica, glass bead, clay and so on. The thermosetting resin composition of the present invention may contain at least one kind of these fillers.

Examples of the organic.inorganic coloring agent are titanium oxide, carbon black, Phthalocyanine Blue and so on. The thermosetting resin composition of the present invention may contain at least one kind of these coloring agents.

The component (II) may be added to the thermosetting resin composition of the present invention not only as a matrix component but also as a solvent. In this case, a solvent is not required. When the thermosetting resin composition of the present invention does not contain solvent, a cured film having further excellent solder-resisting properties can be formed.

According to the present invention, it is preferable that the thermosetting resin composition of the present invention comprises 100 parts by weight of the component (I), 50~300 (more preferably 150~250) parts by weight of the component (II), 5~20 (more preferably 8~15) parts by weight of the component (III), 50~200 (more preferably 60~120) parts by weight of the component (IV) and 5~30 (more preferably 10~20) parts by weight of the component (V).

When the component (II) is less than 50 parts by weight, applicability to the substrate sometimes deteriorates. Contrary to this, when the component (II)is in excess of 300 parts by weight, the heat-resistance of the undercoat sometimes decreases.

When the component (III) is less than 5 parts by weight, the primary curing can not be sufficiently accomplished. As a result, the cured film obtained is sometimes sticky and can not be sufficiently polished. Contrary to this, when the component (III) is in excess of 20 parts by weight, the primary curing reaction can not be so accelerated.

When the component (IV) is less than 50 parts by weight, the viscosity of the thermosetting resin composition does not decrease sufficiently before the primary curing reaction and air bubbles remain in the resin applied to the substrate. Contrary to this, when the component (IV)is in excess of 200 parts by weight, the surface of the primary cured film is sticky and the subsequent polishing process can not be accomplished sufficiently.

When the component (V) is less than 5 parts by weight, the secondary curing reaction can not be carried out sufficiently and the properties such as heat-resistance, humidity-resistance and so on of the cured film obtained are not sufficient. Contrary to this, when the component (V) is in excess of 30 parts by weight, the secondary curing reaction can not be so accelerated.

The thermosetting resin composition of the present invention may be prepared, for example, by mixing the components (I)~(V) with additives if necessary, dispersing the materials uniformly and carrying out deaeration under vacuum. The order of addition of each of the components is not particularly limited. Each of the components may be added sequentially or all components may be added at the same time.

Taking the applicability to the substrate into consideration, the thermosetting resin composition of the present invention prepared in such a manner as above described has preferably the resin viscosity (Pa·s, room temperature) of 10~50, particularly 15~30.

A process for preparing a smooth board is described below. The process comprises applying the thermosetting resin composition of the present invention to a recess on the surface of a substrate, carrying out primary curing at low temperatures, polishing the surface, and then carrying out secondary curing at high temperatures.

The process is applicable to the planarization of all recesses on the substrate,that is, the to planarization of various kinds of recesses, for example, the recess between circuits on the printed wiring board, the recess of a via, and the recess into which the parts are buried and so on.

The term "substrate" herein used means a board-like object to which the thermosetting resin composition of the present invention is applied. The substrate includes a mono-layer substrate and a multi-layer substrate and so on. Further, the substrate includes those on which various kinds of parts (electronic parts and so on) are mounted and not mounted. Concrete example of the substrate are a substrate for an electronic component such as a printed wiring board, a printed circuit board, an insulating board and so on.

The term "smooth board" herein used means a board-like object at least a part of the surface of which is treated with the above-described planarization method.

A process for preparing a smooth board using the present invention is described with reference to the production of the printed wiring board, with recesses between circuits, which is treated with the planarization technique. That is to say, the smooth printed wiring board is prepared by applying the thermosetting resin composition to the recess on the surface of the printed wiring board, carrying out the primary curing at low temperatures, polishing the surface, and then carrying out the secondary curing at high temperatures.

In more detail, first the thermosetting resin composition of the present invention is applied to the recess formed between the conductor circuits on the printed wiring board. The application method is, for example, a screen printing, a roll coating or the like.

Next, the primary curing is carried out at low temperatures. The term "low temperature" herein used means temperatures lower than the secondary curing temperatures. Concretely, the primary curing temperatures may be, for example, between 100~150° C. When the primary curing temperature is extremely low, the component (IV) can not be sufficiently dissolved and hence air bubbles remain in the cured film obtained. Contrary to this, when the primary curing temperature is extremely high, the secondary curing reaction takes place and the cured film is extremely hardened. As a result, the polishing of the surface can not be accomplished sufficiently.

The primary curing time may be, for example, 30~120 minutes. When the primary curing time is extremely short, the component (IV) can not be sufficiently dissolved and hence the primary curing is accomplished with air bubbles remaining in the cured film. Contrary to this, when the primary curing time is extremely long, the working efficiency decreases.

After primary curing, the surface, including the primary cured film formed as described above, is polished to make the surface smooth. Examples of the polishing method are a mechanical polishing method (belt sander, buff polishing, sandblast, scrub polishing and so on), a chemical polishing method (using persulfate, mixture of hydrogen peroxide with sulfuric acid, inorganic acid, organic acid and so on) and so on. In the present invention, the surface polished has a smoothness having usually irregularity of 5μ and below.

Thereafter, the secondary curing is carried out at high temperatures. The term "high temperatures" herein used means temperatures higher than the afore-mentioned primary curing temperature. The secondary curing temperatures may be, for example, between 150~200° C. When the secondary curing temperature is extremely low, the reaction in which an epoxy group takes part does not progress sufficiently, and hence the heat-resistance and humidity-resistance of the cured film is unacceptably low. Contrary to this, when the secondary curing temperature is extremely high, the substrate per se suffers thermal damage.

The secondary curing time may be, for example, 30~180 minutes. When the secondary curing time is extremely short, the heat-resistance and humidity-resistance of the cured film are not sufficient. Contrary to this, when the secondary curing time is extremely long, the working efficiency decreases.

Various kinds of layers may be formed, such as an insulating layer, a protective layer and so on. For example, the insulating layer and/or the protective layer can be laminated on the afore-mentioned polished surface. In this case, the secondary curing can be carried out after these various kinds of layers have been laminated. For example, after the materials for the insulating layer and/or the protective layer are/is laminated on the afore-mentioned polished surface, the above-described materials are cured by heating and/or irradiation with light to form the above-described insulating layer and/or the protective layer. Thereafter, the secondary curing can be carried out.

Alternatively, the formation of the various kinds of layers such as an insulating layer, a protective layer and so on and the secondary curing can be carried out simultaneously. For example, after the afore-mentioned polished surface is coated with the materials for the insulating layer and/or the protective layer, curing can be carried out by heating to the temperature causing the secondary curing while irradiating with light, if necessary.

Examples of materials for the insulating layer are a resin-coated copper foil (RCC), a layer insulating agent (an epoxy resin composition and so on), a prepreg and so on. Examples of materials for the protective layer are a photosensitive solder mask and so on.

Another process for preparing a smooth board using the present invention is described with reference to the production of a printed wiring board in which a recess of a via is smoothed. That is to say, a smooth multi-layer wiring board can be prepared by applying the thermosetting resin composition of the present invention to the via formed on the surface of the substrate for the multi-layer printed wiring board, carrying out the primary curing at low temperatures, polishing the surface, forming the conductor circuits, coating with the insulating layer and/or the protective layer, and thereafter carrying out the secondary curing at high temperatures.

In more in detail, first, the thermosetting resin composition of the present invention is applied to the via formed on the surface of the substrate coated with a conductive foil (a copper foil, a nickel foil and so on) in the same manner as described above. By the application process, the recess of the via is filled with the thermosetting resin composition of the present invention.

Next, after the primary curing has been accomplished at low temperatures in the same manner as described above, the surface including the primary cured film is polished. In the present invention, the surface polished has a smoothness having usually irregularity of 3µ and below.

Thereafter, a conductor pattern is formed on the surface of the substrate. That is to say, an etching resist process is carried out on the polished surface, then etching is carried out, thereafter the etching resist is removed to form the conductor pattern.

Examples of the etching resist processing are a dry laminate film (laminate) method in which, after coating with a dry film, the dry film is exposed to light and cured through a pattern mask to form a resist; and an electrodeposition method in which unwanted parts of a conductor foil are previously coated with an organic resist, then a conductor pattern region is coated with a metal resist by electrodeposition, thereafter only the organic resist is removed, and so on.

In the etching, examples of an etchant include a ferric chloride etching solution, a cupric chloride etching solution, an alkaline etchant, hydrogen peroxide/sulfuric acid and so on. These etchants can be properly selected depending upon the etching resist process used. Removal of the etching resist can be carried out, for example, by spraying a resist removing solution such as aqueous solution of sodium hydroxide and so on to the surface of a panel from a spray nozzle to rinse the resist.

After various kinds of layers have been formed as described above, the secondary curing can be carried out and the printed wiring board, in which the recesses of the vias are smoothed, can be prepared.

After the etching resist has been removed, the afore-mentioned process for preparing the printed wiring board in relation to the recesses between the circuits can be repeated. In this case, the printed wiring board, both the recesses between the circuits and the vias are smoothed.

A smooth board prepared as described above has good properties such as excellent solder-resisting properties, humidity-resistance and so on. For example, a smooth wiring board coated with the protective layer does not suffer from cracking, a blistering, or cleavage and so on, even if it is dipped in melted solder (usually at 260° C.) for 60 seconds.

The procedure of the present invention is described below. In the course of heating the thermosetting resin composition of the present invention to a primary curing temperature, the component (IV) melts first. At that time, the viscosity of the resin decreases remarkably. As a result, substantially all air bubbles in the resin are removed. Thereafter, when the primary curing takes place, substantially no air bubbles do remain in the resin. Therefore, the cured film has good properties such as excellent heat-resistance, humidity-resistance and so on.

In a preferred process using the present invention, not all the polymerizable groups in the resin are cured at once, rather, a two step-curing system including primary curing and secondary curing is employed. Hence, the primary cured film has a crosslinking density which is lower than that of the fully cured film and is not excessively hard. Therefore, the surface of the cured film (primary cured film) can be easily and finely polished to obtain a highly smooth surface.

The present invention will be more clearly understood from the following examples with reference to the following Examples.

[Preparation of the Thermosetting Resin Composition]

EXAMPLES 1~10 AND COMPARATIVE EXAMPLES 1~2

A mixture of component (I) with component (II), component (III), component (IV), component (V) and other components were added sequentially and mixed with stirring to obtain a mixture. Then, the mixture was dispersed uniformly by means of a triple roll mill. The uniform dispersion thus obtained was deaerated under vacuum to form the thermosetting resin composition (each of Examples 1~10 and Comparative Examples 1~2). Each of components and amount of additions (kg) are shown in Table 16 and Table 17.

TABLE 16

| Component (kg) | Example 1 | Example 2 | Example 3 | Example 4 | Example 5 | Example 6 |
|---|---|---|---|---|---|---|
| A | 100 | — | — | 100 | 100 | 100 |
| B | — | — | — | — | — | — |
| C | — | 100 | — | — | — | — |
| D | — | — | 100 | — | — | — |
| E | — | — | — | — | — | — |
| F | — | — | — | — | — | — |
| G | — | — | — | — | — | — |
| H | 40 | 60 | — | — | — | — |
| I | — | — | 100 | 40 | 40 | 40 |
| J | — | 60 | — | — | — | — |
| K | 100 | — | 100 | 80 | 80 | 80 |
| L | 10 | — | — | — | — | — |
| M | — | 100 | 50 | 50 | 50 | 50 |
| N | — | — | — | — | — | — |
| O | 10 | 10 | 10 | 10 | 10 | — |
| P | — | — | — | — | — | 10 |
| Q | 100 | 60 | — | — | — | 100 |
| R | — | — | 100 | 120 | — | — |
| S | — | — | — | — | 100 | — |
| T | 16 | 12 | 15 | 16 | 15 | 16 |
| U | — | — | — | — | — | — |
| V | — | — | — | — | — | — |
| W | — | — | — | — | — | — |
| X | — | — | 150 | — | — | — |
| Y | 120 | — | — | — | — | — |
| Z | — | 100 | — | 100 | 100 | 100 |
| ZZ | 0.1 | 0.1 | 0.1 | 0.1 | 0.1 | 0.1 |

Component (I)
A: adduct of phenolnovolak-type epoxy resin with 75% acrylic acid
B: adduct of cresolnovolak-type epoxy resin with 50% acrylic acid
C: adduct of trisphenylmethane-type epoxy resin with 33% acrylic acid
D: adduct of bisphenol A novolak-type epoxy resin with 60% methacrylic acid
E: adduct of dicyclopentadiene phenol-type epoxy resin with 40% methacrylic acid
F: adduct of phenolnovolak-type epoxy resin with 50% crotonic acid
G: adduct of cresolnovolak-type epoxy resin with 100% acrylic acid
Component (II)
H: isopropyl acrylate
I: dicyclopentanyl methacrylate
J: hydroxypivalic acid neopentyl glycol diacrylate
K: tricyclodecane dimetanol acrylate
L: trimethylolpropane triacrylate
M: dipentaerythritol hexacrylate
N: isobornyl crotonate
Component (III)
O: t-butyl peroxybenzoate
P: t-butyl peroxyisopropyl carbonate
Component (IV)
Q: tetramethylbiphenyl-type epoxy resin
R: hydroquinone diglycidyl ether
S: di-(p-glycidylphenyl) ether
Component (V)
T: dicyandiamide
U: 2,4-diamino-6-(2'-methylimidazolyl-(1'))-ethyl-s-triazine
V: phenolnovolak-type epoxy resin
W: liquid bisphenol A-type epoxy resin
X: silica
Y: barium sulfate
Z: aluminum hydroxide
ZZ: polydimethylsiloxane

TABLE 17

| Component (kg) | Example 7 | Example 8 | Example 9 | Example 10 | Comp. Ex. 1 | Comp. Ex. 2 |
|---|---|---|---|---|---|---|
| A | — | — | — | — | 100 | — |
| B | — | 100 | — | — | — | — |
| C | — | — | — | — | — | — |
| D | — | — | — | — | — | — |
| E | — | — | 100 | — | — | — |
| F | — | — | — | 100 | — | — |
| G | 100 | — | — | — | — | — |
| H | 60 | 50 | 50 | — | 40 | 60 |
| I | — | — | 50 | — | — | — |
| J | 60 | — | — | — | — | 60 |
| K | — | — | 100 | 100 | 100 | — |
| L | — | 50 | — | — | 10 | — |
| M | 100 | 100 | — | 80 | — | 100 |
| N | — | — | — | 50 | — | — |
| O | 10 | 10 | 10 | 10 | 10 | 10 |
| P | — | — | — | — | — | — |
| Q | 100 | 80 | — | 120 | — | 100 |
| R | — | — | — | — | — | — |
| S | — | — | 100 | — | — | — |
| T | 16 | — | 15 | 20 | 16 | — |
| U | — | 10 | — | — | — | 20 |
| V | — | — | — | — | — | 100 |
| W | — | — | — | — | 100 | — |
| X | 150 | 150 | 150 | — | — | 150 |
| Y | — | — | — | 150 | 120 | — |
| Z | — | — | — | — | — | — |
| ZZ | 0.1 | 0.1 | 0.1 | 0.1 | 0.1 | 0.1 |

Component (I)
A: adduct of phenolnovolak-type epoxy resin with 75% acrylic acid
B: adduct of cresolnovolak-type epoxy resin with 50% acrylic acid
C: adduct of trisphenylmethane-type epoxy resin with 33% acrylic acid
D: adduct of bisphenol A novolak-type epoxy resin with 60% methacrylic acid
E: adduct of dicyclopentadiene phenol-type epoxy resin with 40% methacrylic acid
F: adduct of phenonolvolak-type epoxy resin with 50% crotonic acid
G: adduct of cresolnovolak-type epoxy resin with 100% acrylic acid
Component (II)
H: isopropyl acrylate
I: dicyclopentanyl methacrylate
J: hydroxypivalic acid neopentyl glycol diacrylate
K: tricyclodecane dimetanol acrylate
L: trimethylolpropane triacrylate
M: dipentaerythritol hexacrylate
N: isobornyl crotonate
Component (III)
O: t-butyl peroxybenzoate
P: t-butyl peroxyisopropyl carbonate
Component (IV)
Q: tetramethylbiphenyl-type epoxy resin
R: hydroquinone diglycidyl ether
S: di-(p-glycidylphenyl) ether
Component (V)
T: dicyandiamide
U: 2,4-diamino-6-(2'-methylimidazolyl-(1'))-ethyl-s-triazine
V: phenolnovolak-type epoxy resin
W: liquid bisphenol A-type epoxy resin
X: silica
Y: barium sulfate
Z: aluminum hydroxide
ZZ: polydimethylsiloxane

[Preparation of a Printed Wiring Board with Recesses Between Circuits, which is Smoothed]

EXAMPLES 11~17

A printed wiring board 1.6 mm thick (copper circuit thickness 40 μ, L/S=75μ) was used as a substrate. That is to say, the thermosetting resin composition (each Example 1~7) was applied to the substrate by masking printing using a polyester screen of 250 mesh.

Figure 3:
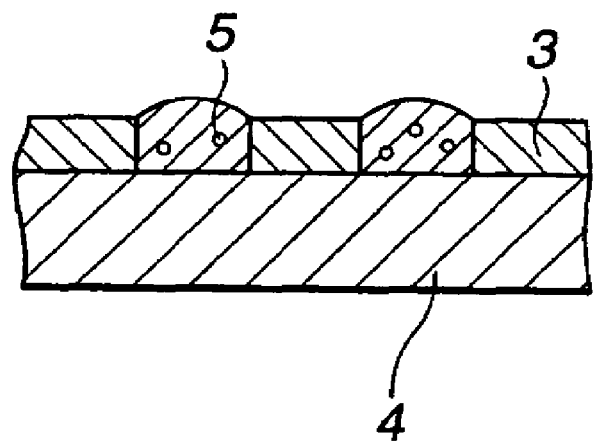
FIG. 3 is a cross-sectional view of the printed wiring board after the thermosetting resin composition has been applied.

As shown in FIG. 3, air bubbles (5) in the resin applied were examined using a microscope ×30 magnification. The results obtained are shown in Tables 18 and 19.

Next, the substrate thus prepared was heated up to 150° C. in a heating oven and the primary curing was carried out for one hour at this temperature.

Air bubbles in the primary cured film were examined using a microscope ×30 magnification. The surface hardness of the primary cured film was measured by a pencil hardness test (JISK-5400). The results obtained are shown in Tables 18 and 19.

Figure 4:
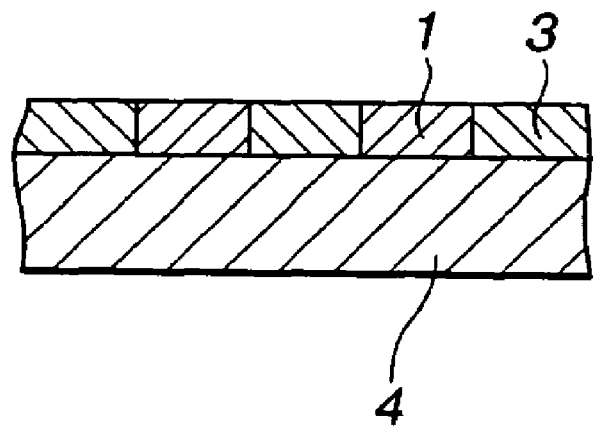
FIG. 4 is a cross-sectional view of the printed wiring board after the surface has been polished.
Figure 5:
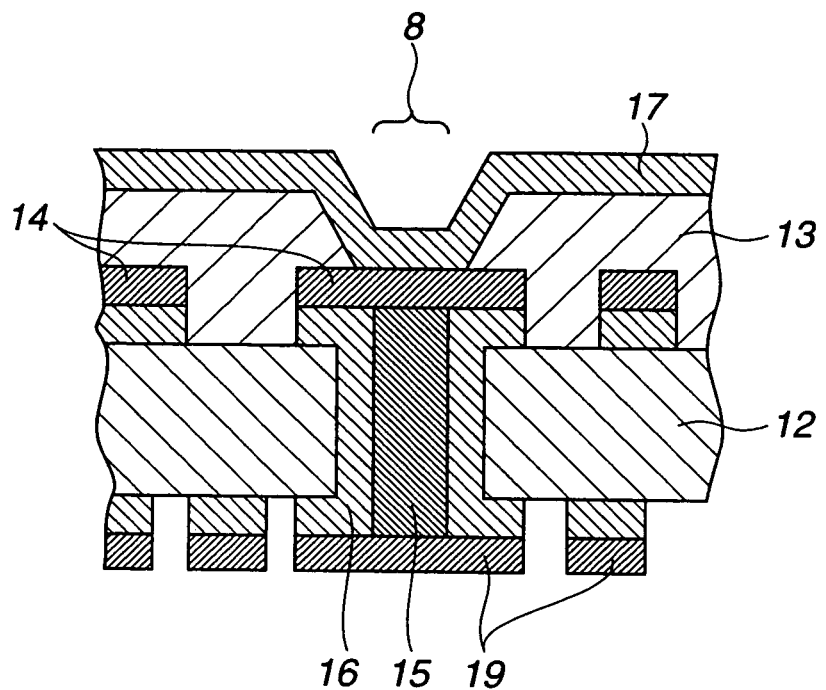
FIG. 5 is a cross-sectional view of the copper-clad substrate for the multi-layer printed wiring board.

Thereafter, the surface on the side including the primary cured film was polished once by using a #400 belt sander, and then polished four times by using a #600 buff. No part remained unpolished and satisfactory polishing was accomplished. The unevenness between the conductor circuits was examined by a surface roughness measuring instrument. The results obtained are shown in Tables 18 and 19. In FIG. 4, a cross-sectional view of the printed wiring board after polishing is shown.

Finally, RCC was laminated on the polished surface, heated up to 180° C. by a vacuum press, and then the secondary curing was carried out for 90 minutes at this temperature to form the smooth printed wiring board, the recesses between the circuits of which were smoothed (each of examples 11~17). In FIG. 1, the cross-sectional view is shown.

The solder-resisting properties of the printed wiring board thus obtained was examined as described below. That is to say, the printed wiring board was dipped in melted solder at a temperature of 260° C. for 60 seconds. Thereafter, cracks, blisters and a cleavage were examined. The results are shown in Tables 18 and 19.

The humidity-resistance of the printed wiring board obtained was examined as described below. That is to say, the printed wiring board was first allowed to stand for 168 hours in an environment with a temperature of 85° C. and a RH (relative humidity) of 85%. Then, the printed wiring board was preserved for 24 hours in an environment with a temperature of 25° C. and a RH (relative humidity) of 60%. Thereafter, the printed wiring board was dipped in melted solder at a temperature of 260° C. for 60 seconds. Thereafter, cracks, blisters and cleavage were examined. The results obtained are shown in Table 18 and Table 19.

COMPARATIVE EXAMPLE 3

Similarly to examples 11~17, an application of the thermosetting resin composition to a substrate and primary curing were carried out, except that the thermosetting resin composition used in comparative example 1 was used instead of those used in examples 1~7.

Thereafter, while surface polishing similar to that carried out in examples 11~17 was tried, the polishing could not be carried out because of the stickiness of the surface and the subsequent processes could also not be carried out. Similar to examples 11~17, air bubbles in the resin of the thermosetting resin composition applied to the substrate and air bubbles in the primary cured film were examined. The results obtained are shown in Table 19.

[Preparation of a Multi-layer Printed Wiring Board, the Recesses of a Via on which is Smoothed]

EXAMPLES 18~20

A copper-clad substrate having a via for a multi-layer printed wiring board was used. The copper-clad substrate for the multi-layer printed wiring board comprised the via (8), the insulating substrate (12), the insulating layer (13), the conductor circuits (11), (14), (16) and (19), the resin embedded (15) and the copper foil (17) and had an overall thickness of 0.8 mm. The thickness of the copper foil (17) was 20 μ. The L/S of the copper foil (17) was 50 μ. The diameter of the via (8) was 75 μ.

Similarly to examples 11~17, an application of the thermosetting resin composition to the substrate and primary curing were carried out, except that the thermosetting resin compositions used in examples 8~10 were used instead of those used in examples 1~7 and a primary curing temperature of 110° C. was used in example 18 instead of 150° C.

Figure 6:
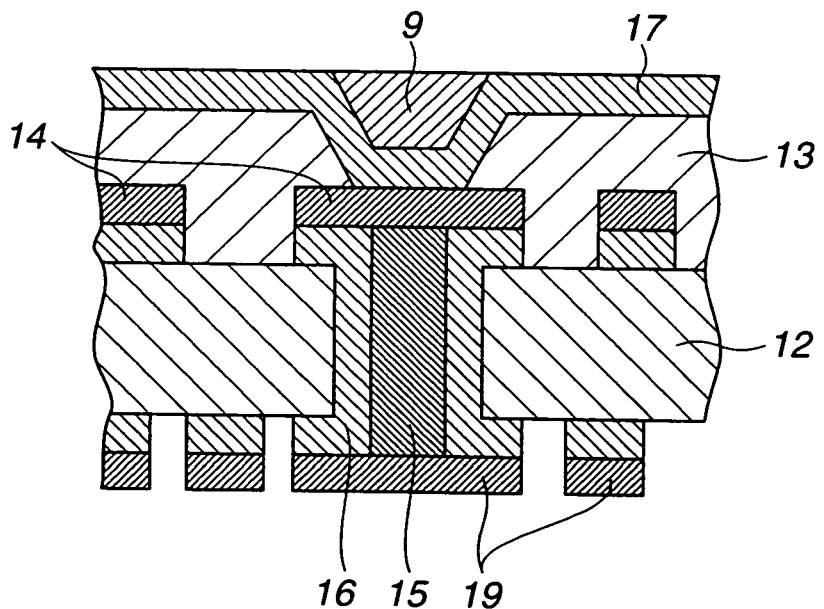
FIG. 6 is a cross-sectional view of the copper-clad substrate for the multi-layer printed wiring board after the surface has been polished.
Figure 7:
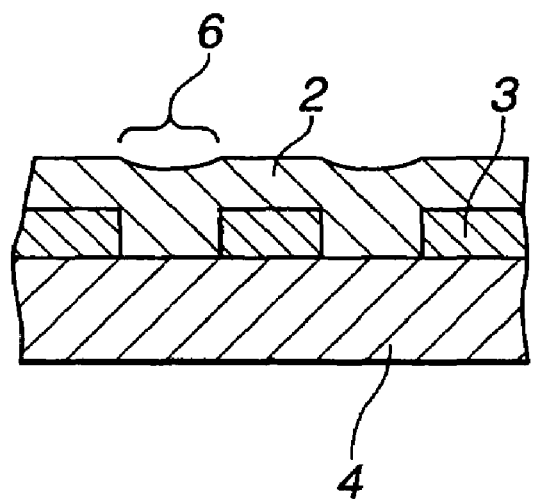
FIG. 7 is a cross-sectional view of the printed wiring board to which a topcoat is directly laminated.
Figure 8:
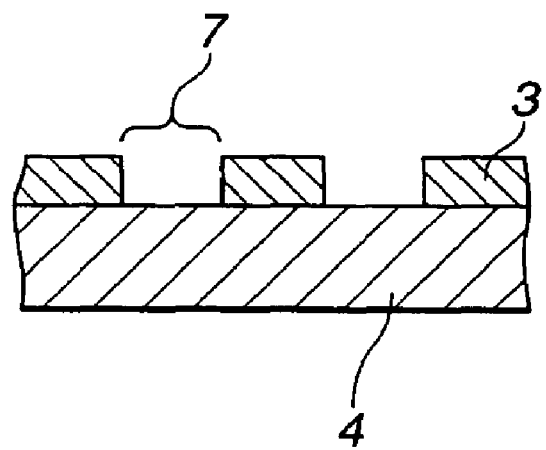
FIG. 8 is a cross-sectional view of the printed wiring board without a topcoat.

Thereafter, the surface on the side including the primary cured film was polished once by using a #400 buff, and then polished four times by using a #600 buff. No part remained unpolished and satisfactory polishing was accomplished. In FIG. 6, a cross-sectional view of the polished substrate is shown. In FIG. 6, (9) is an undercoat (primary cured film).

The unevenness around the via (8) was examined by a surface roughness measuring instrument. The results obtained are shown in Table 19.

Thereafter, a conductor pattern was formed on the polished surface as described below: First, an etching resist was formed using a dry film by means of a dry film (laminate) method. That is to say, the dry film was laminated on the above-described polished surface, and a negative-type film (pattern mask) was superimposed thereon, then exposure and curing were carried out by an ultra-high pressure mercury lamp.

Then, the carrier film of the dry film was removed to expose the resist. A developing solution was sprayed from a spray nozzle on the surface of the resist exposed to develop and rinsed. An aqueous solution of sodium carbonate (1%) was used for the developing agent.

Next, etching was carried out. That is to say, an aqueous solution of ferric chloride (36% by weight) was sprayed from a spray nozzle on the surface coated with the etching resist as described to dissolve and remove an unnecessary copper foil.

After completion of the above-described etching, a 3% aqueous solution of sodium hydroxide was sprayed from a spray nozzle on the surface etched as above described to wash the etching resist while swelling.

After the conductor pattern was formed as described, the conductor pattern was coated with a solder mask, and secondary curing was carried out. That is to say, a UV and heat-curable acrylate/epoxy mixed resin was screen-stenciled on the surface on which the conductor pattern was formed by a squeegee (squeegee hardness: 75) through a 150-mesh Tetoron screen.

Next, after completion of a pre-bake at temperatures of 75~80° C. in a warm air drying oven, exposure (300 mj/cm$^2$) and curing were carried out. Development was effected by making use of a 1% sodium carbonate solution (30° C., 2.5 kg/cm$^2$). Thereafter, heating was carried out at 170° C. for 30 minutes to perform curing.

Figure 2:
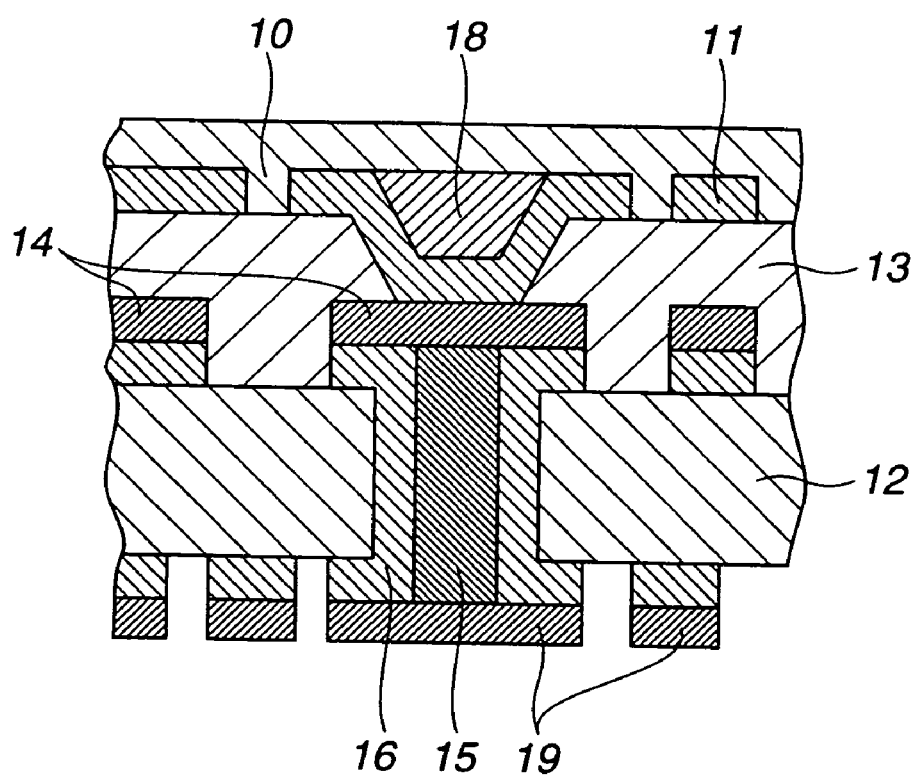
FIG. 2 is a cross-sectional view of the multi-layer printed wiring board the recess of the via on which is smoothed according to the present invention.

A multi-layer printed wiring board with a recess of a via, which was smoothed, was prepared as described above (examples 18~20). In FIG. 2, its cross-sectional view is shown. In FIG. 2, (10) is a topcoat (solder mask) and (18) is an undercoat (secondary cured film).

Similar to examples 11~17, air bubbles in the resin of the thermosetting resin composition applied to the substrate, air bubbles in the primary cured film, the surface hardness of the primary cured film, the solder-resistance, and the humidity-resistance were examined. The results obtained are shown in Table 19.

COMPARATIVE EXAMPLE 4

The same copper-clad substrate for the multi-layer printed wiring board as that used in examples 18~20 was used as a substrate. Similarly to examples 18~20, an application of the thermosetting resin composition to the substrate and the primary curing were carried out, except that the thermosetting resin composition used in comparative example 2 was used instead of those used in examples 8~10.

Thereafter, while the surface polishing similar to that carried out in examples 18~20 was tried, the polishing could not be carried out because of the stickiness of the surface and the subsequent processes could also not be carried out. Similar to examples 18~20, air bubbles in the resin of the thermosetting resin composition applied to the substrate and air bubbles in the primary cured film and the hardness of the primary cured film were examined. The results obtained are shown in Table 19.

TABLE 18

| | Example 11 | Example 12 | Example 13 | Example 14 | Example 15 | Example 16 |
|---|---|---|---|---|---|---|
| *1 | Example 1 | Example 2 | Example 3 | Example 4 | Example 5 | Example 6 |
| *2 | air bubble of 50~100 μ | air bubble of 50~100 μ | air bubble of 50~100 μ | air bubble of 50~100 μ | air bubble of 50~100 μ | air bubble of 50~100 μ |
| *3 | nil | nil | nil | nil | nil | nil |
| *4 | H | 3H | H | H | H | H |
| *5 | within 3μ | within 3μ | within 3μ | within 3μ | within 3μ | within 3μ |
| *6 | nil | nil | nil | nil | nil | nil |
| *7 | nil | nil | nil | nil | nil | nil |
| *8 | nil | nil | nil | nil | nil | nil |
| *9 | nil | nil | nil | nil | nil | nil |

*1: thermosetting resin composition used
*2: air bubbles in the resin applied to the substrate
*3: air bubbles in the primary cured film
*4: surface hardness of the primary cured film
*5: unevenness after polishing
*6: solder-resistance: crack
*7: solder-resistance: blister, cleavage
*8: humidity-resistance: crack
*9: humidity-resistance: blister, cleavage

TABLE 19

| | Example 17 | Example 18 | Example 19 | Example 20 | Com. Ex. 3 | Com. Ex. 4 |
|---|---|---|---|---|---|---|
| *1 | Example 7 | Example 8 | Example 9 | Example 10 | Com. Ex. 1 | Com. Ex. 2 |
| *2 | air bubble of 50~100μ | air bubble of 50μ | air bubble of 50μ | air bubble of 50μ | air bubble of 50~100μ | air bubble of 50μ |
| *3 | nil | nil | nil | nil | air bubble of 50μ | nil |
| *4 | 2H | H | H | H | adhesive | adhesive |
| *5 | within 3μ | within 3μ | within 3μ | within 3μ | — | — |
| *6 | nil | nil | nil | nil | — | — |
| *7 | nil | nil | nil | nil | — | — |
| *8 | nil | nil | nil | nil | — | — |
| *9 | a little | nil | nil | nil | — | — |

*1: thermosetting resin composition used
*2: air bubbles in the resin applied to the substrate
*3: air bubbles in the primary cured film
*4: surface hardness of the primary cured film
*5: unevenness after polishing
*6: solder-resistance: crack
*7: solder-resistance: blister, cleavage
*8: humidity-resistance: crack
*9: humidity-resistance: blister, cleavage As evident from Tables 18 and 19, the printed wiring board (examples 11~17) and the multi-layer printed wiring board (examples 18~20) prepared by the use of the thermosetting resin composition of the present invention never (or scarcely) suffered disadvantages such as cracks, blisters, cleavage and so on, even if they were dipped in melted solder at high temperatures, and are excellent in solder-resistance and humidity-resistance.

When a thermosetting resin composition which did not contain the component (IV) (Comparative Example 1) was used, air bubbles remain in the cured film. Further, the primary cured film has stickiness, and hence polishing of the surface could not be carried out and nor could the subsequent processes (Comparative Example 3).

When an epoxy resin to which an unsaturated aliphatic acid had not been added at all (Comparative Example 2) was used instead of the component (I), the primary cured film had stickiness, and hence the polishing of the surface could can not be carried out and nor could the subsequent processes (Comparative Example 4).

By using the thermosetting resin composition of the present invention, the polishing of the cured film can be easily carried out and the highly smooth board [smooth (multilayer) printed wiring board] can be produced.

Further, by using the thermosetting resin composition of the present invention, it can be made possible to leave no air bubbles in the cured film.

Therefore, the smooth board [smooth (multi-layer) printed wiring board and so on] prepared by the use of the thermosetting resin composition of the present invention is excellent in solder-resistance, humidity-resistance and so on.

What is claimed is:

1. A process for preparing a smooth board comprising:
applying a thermosetting resin composition to a recess on the surface of a substrate;
carrying out primary curing of said thermosetting resin composition at a primary curing reaction starting temperature;
polishing the surface of said thermosetting resin composition; and
carrying out secondary curing of said thermosetting resin composition at a temperature of 150 to 200° C.;
wherein said thermosetting resin composition comprises (I) 100 parts by weight of an adduct of an epoxy resin with an unsaturated aliphatic acid, the unsaturated aliphatic acid being added to 20%-80% of epoxy groups in the epoxy resin, (II) 50 to 300 parts by weight of a (meth)

acrylate, (III) 5 to 20 parts by weight of a radical polymerization initiator, (IV) 50 to 200 parts by weight of a crystallizable epoxy resin, and (V) 5 to 30 parts by weight of a latent curing agent, capable of a primary curing reaction at the primary curing reaction starting temperature, and a secondary curing reaction at the temperature of 150 to 200° C., wherein the melting point of component (IV) is in a range of 80 to 110° C. which is lower than the primary curing reaction starting temperature and the viscosity of component (IV) when above its melting point is below 50 (mPa·s).

2. A process for preparing a smooth board as claimed in claim 1, wherein component (I) is an epoxy resin having an epoxy value in the range 130 to 400.

3. A process for preparing a smooth board as claimed in claim 2, wherein the epoxy resin is selected from the group consisting of an epoxy resin derived from a polyfunctional phenol, an epoxy resin having a naphthalene skeleton, a glycidylamine-epoxy resin, an epoxy resin having a triazine skeleton, a glycidylester-epoxy resin, and an alicyclic-epoxy resin.

4. A process for preparing a smooth board as claimed in claim 1, wherein component (II) comprises esters of (meth) acrylic acids with hydroxyl compounds.

5. A process for preparing a smooth board as claimed in claim 1, wherein component (III) comprises an initiator for the primary curing reaction and has a radical polymerization starting temperature higher than the melting point of the crystallizable epoxy resin (IV) and lower than the starting temperature of the secondary curing reaction.

6. A process for preparing a smooth board as claimed in claim 5, wherein component (III) has a radical polymerisation temperature in the range 60 to 150° C.

7. A process for preparing a smooth board as claimed in claim 1, wherein component (III) enables an unsaturated bond derived from an unsaturated aliphatic acid which takes part in the primary curing reaction in preference to any epoxy group.

8. A process for preparing a smooth board as claimed in claim 1, wherein component (IV) has a melting point between ambient temperatures and the primary curing reaction starting temperature.

9. A process for preparing a smooth board as claimed in claim 8, wherein the melting point of component (IV) is in the range 90 to 105° C.

10. A process for preparing a smooth board as claimed in claim 1, wherein the viscosity of component (IV) when above its melting point is 0.1-20 mPa.

11. A process for preparing a smooth board as claimed in claim 1, wherein component (IV) is only slightly soluble in the thermosetting resin composition as a whole.

12. A process for preparing a smooth board as claimed in claim 1, wherein component (V) comprises a latent curing agent for the secondary curing reaction and has a secondary curing reaction starting temperature which is higher than the primary curing reaction starting temperature.

13. A process for preparing a smooth board as claimed in claim 12, wherein component (V) has a secondary curing reaction starting temperature in the range 170 to 200° C.

14. A process for preparing a smooth board as claimed in claim 1, wherein it contains additives selected from the group consisting of fillers, organic and inorganic coloring agents, fire retardants, and anti-foaming agents.

15. A process for preparing a smooth board as claimed in claim 1, wherein it comprises 100 parts by weight of the component (I), 150~250 parts by weight of the component (II), 8~15 parts by weight of the component (III), 60~120 parts by weight of the component (IV), and 10~20 parts by weight of the component (V).

16. A process for preparing a smooth printed wiring board comprising:
 applying a thermosetting resin composition to a recess on the surface of a printed wiring board;
 carrying out primary curing of said thermosetting resin composition at a primary curing reaction starting temperature;
 polishing the surface of said thermosetting resin composition; and
 carrying out secondary curing of said thermosetting resin composition at a temperature of 150 to 200° C.;
 wherein said thermosetting resin composition comprises (I) 100 parts by weight of an adduct of an epoxy resin with an unsaturated aliphatic acid, the unsaturated aliphatic acid being added to 20%-80% of epoxy groups in the epoxy resin, (II) 50 to 300 parts by weight of a (meth) acrylate, (III) 5 to 20 parts by weight of a radical polymerization initiator, (IV) 50 to 200 parts by weight of a crystallizable epoxy resin, and (V) 5 to 30 parts by weight of a latent curing agent, capable of a primary curing reaction at the primary curing reaction starting temperature, and a secondary curing reaction at the temperature of 150 to 200° C., wherein the melting point of component (IV) is in a range of 80 to 110° C. which is lower than the primary curing reaction starting temperature and the viscosity of component (IV) when above its melting point is below 50 (mPa·s).

* * * * *

UNITED STATES PATENT AND TRADEMARK OFFICE
CERTIFICATE OF CORRECTION

PATENT NO. : 7,410,673 B2
APPLICATION NO. : 10/920809
DATED : August 12, 2008
INVENTOR(S) : Sato et al.

It is certified that error appears in the above-identified patent and that said Letters Patent is hereby corrected as shown below:

Column 25, line 63 reads "theprimary" and should read --the primary--

Column 39, line 36 reads "F: adduct of phenolnvolak" and should read --F: adduct of phenonolvolak--

Claim 6, column 45, line 33 reads "polymerization" and should read --polymerization--

Signed and Sealed this

Twenty-eighth Day of October, 2008

JON W. DUDAS
*Director of the United States Patent and Trademark Office*